(12) United States Patent
Gross et al.

(10) Patent No.: US 9,784,762 B2
(45) Date of Patent: *Oct. 10, 2017

(54) DETERMINATION OF LOCAL CONTACT POTENTIAL DIFFERENCE BY NONCONTACT ATOMIC FORCE MICROSCOPY

(71) Applicant: International Business Machines Corporation, Armonk, NY (US)

(72) Inventors: Leo Gross, Adliswil (CH); Gerhard Meyer, Wollerau (CH); Bruno Schuler, Siebnen (CH); Wolfram Steurer, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/059,371

(22) Filed: Mar. 3, 2016

(65) Prior Publication Data

US 2016/0223583 A1 Aug. 4, 2016

Related U.S. Application Data

(63) Continuation of application No. 14/524,261, filed on Oct. 27, 2014, now Pat. No. 9,316,668.

(30) Foreign Application Priority Data

Oct. 31, 2013 (CH) .................................... 1319250

(51) Int. Cl.
*G01Q 60/30* (2010.01)
*G01Q 60/32* (2010.01)
*G01Q 30/06* (2010.01)
*G01R 19/00* (2006.01)

(52) U.S. Cl.
CPC ............. *G01Q 60/30* (2013.01); *G01Q 30/06* (2013.01); *G01Q 60/32* (2013.01); *G01R 19/0084* (2013.01)

(58) Field of Classification Search
USPC ......................................................... 850/33
See application file for complete search history.

(56) References Cited

U.S. PATENT DOCUMENTS

| | | | |
|---|---|---|---|
| 7,084,661 B2 * | 8/2006 | Thompson | B82Y 35/00 324/750.22 |
| 7,609,048 B2 | 10/2009 | Kusaka | |
| 8,087,289 B2 | 1/2012 | Alexander et al. | |

(Continued)

OTHER PUBLICATIONS

Mohn et.al, "Imaging the charge distribution within a single molecule", Nature Nanotechnology, Feb. 2012, pp. 1-5.*

(Continued)

*Primary Examiner* — Phillip A Johnston
(74) *Attorney, Agent, or Firm* — Isaac J. Gooshaw (57) ABSTRACT

A method for determining a value of a local contact potential difference by noncontact atomic force microscopy. For one or more cantilever positions above a surface of a sample: i) determining two distinct voltage values of DC voltage applied between an oscillating cantilever and the sample, and ii) determining, by one or more processors, a value of a local contact potential difference based, at least in part, on the two distinct voltage values that were determined.

19 Claims, 4 Drawing Sheets

(56) References Cited

U.S. PATENT DOCUMENTS

| | | | | |
|---|---|---|---|---|
| 8,347,411 | B2* | 1/2013 | Ziegler | B82Y 35/00 73/105 |
| 8,443,461 | B2 | 5/2013 | Ohnesorge | |
| 8,686,358 | B2* | 4/2014 | Ginger | B82Y 35/00 250/306 |
| 2011/0261352 | A1 | 10/2011 | Ohta et al. | |
| 2013/0276174 | A1* | 10/2013 | Li | B82Y 35/00 850/6 |

OTHER PUBLICATIONS

Brown et al., "High Spatial Resolution Kelvin Probe Force Microscopy With Coaxial Probes", Digital Access to Scholarship at Harvard, Oct. 16, 2014 2:48:27 PM EDT, pp. 1-15, doi:10.1088/0957-4484/23/11/115703, <http://nrs.harvard.edu/um-3:HUL.InstRepos:9639955>.

Burke et al., "Determination of the local contact potential difference of PTCDA on NaCl: a comparison of techniques", IOP Publishing Nanotechnology, Nanotechnology 20 (2009) 264012 (8pp),Received Dec. 1, 2008, in final form Jan. 15, 2009, Published Jun. 10, 2009, <stacks.iop.org/Nano/20/264012>, 0957-4484/09/264012+08, © 2009 IOP Publishing 1 Ltd, pp. 1-8, doi:10.1088/0957-4484/20/26/264012.

Dana et al.,"Electrostatic force spectroscopy of near surface localized states", Published Feb. 3, 2005, pp. 125-133, doi 10.10.1088/0957-4484/16/3/023, Institute of Physics Publishing, Nanotechnology.

Guo et al., "Open-loop band excitation Kelvin probe force microscopy", IOP Publishing, Nanotechnology, pp. 1-9, Published Mar. 9, 2012, doi: 10.1088/0957-4484/23/12/125704, Copyright 2012 IOP Publishing Ltd.

Mohn et al., "Different tips for high-resolution atomic force microscopy and scanning tunneling microscopy of single molecules", AIP Applied Physics Letters, Citation: Applied Physics Letters 102, 073109 (2013); <http://dx.doi.org/10.1063/1.4793200>.

Pang, "A non-contact atomic force microscopy and 'force spectroscopy' study of charging on oxide surfaces", Published Jun. 4, 2004, pp. 862-866, doi 10.10.1088/0957-4484/15/7/027, Institute of Physics Publishing, Nanotechnology.

Zerweck et al., "Accuracy and Resolution Limits of Kelvin Probe Force Microscopy", Dated: Jan. 7, 2005, pp. 1-23, PACS Nos. 68.37.Ps/07.10.P/73.30.+y, BX9256.

Ziegler, et al., Force gradient sensitive detection in lift-mode Kelvin probe force microscopy, IOP Publishing, Nanotechnology, pp. 1-9, Published Jan. 14, 2011, doi: 10.1088/0957-4484/22/7/075501, Copyright 2011 IOP Publishing Ltd.

Intellectual Property Office, Application No. 1319250.5, Search Report, Apr. 7, 2014.

U.S. Appl. No. 14/524,261, entitled "Determination of Local Contact Potential Difference by Noncontact Atomic Force Microscopy", filed Oct. 27, 2014.

Gross et al., "Measuring the Charge State of an Adatom with Noncontact Atomic Force Microscopy", Science, vol. 324, Jun. 12, 2009, pp. 1428-1432, Downloaded from <http://science.sciencemag.org/>.

Mohn et al., "Imaging the charge distribution within a single molecule", Nature Nanotechnology, Published Online: Feb. 26, 2012, IBM Research—Zurich, 8803 Ruschlikon, Switzerland, © 2012 Macmillan Publishers Limited, pp. 1-5.

Sadewasser et al., "New Insights on Atomic-Resolution Frequency-Modulation Kelvin-Probe Force-Microscopy Imaging of Semiconductors", Physical Review Letters, PRL 103, 266103 (2009), Dec. 31, 2009, © 2009 The American Physical Society, pp. 266103-1—266103-4.

* cited by examiner

DETERMINATION OF LOCAL CONTACT POTENTIAL DIFFERENCE BY NONCONTACT ATOMIC FORCE MICROSCOPY

CROSS REFERENCE TO RELATED APPLICATION

Pursuant to 35 U.S.C. §119, the present application claims priority to United Kingdom Application No. 1319250.5, filed Oct. 31, 2013, the entire contents of which are incorporated herein by reference.

FIELD OF THE INVENTION

The invention relates in general to the field of Kelvin probe force microscopy (KPFM) and related microscopy techniques. In particular, it concerns methods for determining a value of a local contact potential difference and for acquiring local contact potential difference maps, by non-contact atomic force microscopy, as well as related apparatuses.

BACKGROUND OF THE INVENTION

Scanning probe microscopy is born with the invention of the scanning tunneling and the atomic force microscope. In brief, it aims at forming images of sample surfaces using a physical probe. Scanning probe microscopy techniques rely on scanning such a probe, e.g. a sharp tip, just above or in contact with a sample surface whilst monitoring interaction between the probe and the surface. An image of the sample surface can thereby be obtained. Typically, a raster scan of the sample is carried out and the probe-surface interaction is recorded as a function of position. Data are thus typically obtained as a two-dimensional grid of data points. The resolution achieved varies with the actual technique used: atomic resolution can be achieved in some cases. Typically, either piezoelectric actuators or electrostatic actuation are used to execute precise motions of the probe. Two main types of SPM are the scanning tunneling microscopy (STM) and the atomic force microscopy (AFM).

In AFM techniques, forces between the tip and the surface are monitored; these are notably the short range Pauli repulsive force (in contact-mode) and the longer range attractive force (in non-contact mode, e.g., the van der Waals forces). Using AFM techniques, imaging of the surface topology is usually carried out in one of three modes: contact mode, non-contact mode and intermittent contact or tapping mode. In the contact mode, the probe is moved over the surface with constant contact thus monitoring the surface by changing the height set-point. In the non-contact (or "non-contact") mode, a stiff cantilever oscillates with a small amplitude of typically less than 10 nm above the surface. Influences of the surface lead to changes in frequency and amplitude of the cantilever. These changes can be detected and used as the feedback signals. In the tapping mode, the cantilever is oscillated with a larger amplitude. Therefore also short range forces are detectable without sticking of the cantilever to the surface. Still, the short range forces can be measured also in non-contact AFM, even using small amplitudes, e.g., using the so-called 'qPlus sensor', a tuning fork or a length extension resonator.

The above techniques are translated into topography by means of a sensor. A common type of sensor is a bulk-component-based free-space laser beam deflection setup with a four quadrant photo diode acting as the deflection sensor. Other known principles include piezoelectric, piezoresistive and thermal height sensing deflection sensors. In both STM and AFM, the position of the tip with respect to the surface must be accurately controlled (e.g., to within about 0.1 Å) by moving either the sample or the tip. The tip is usually very sharp; ideally terminated by a single atom or molecule at its closest point to the surface.

Kelvin probe force microscopy (or KPFM, also known as "surface potential microscopy") and the closely related "electrostatic force microscopy" (EFM) are noncontact variants of AFM. KPFM measures work function differences or the surface potential (for non-metals) between a conducting sample and a vibrating tip, at atomic scales. Note that the concept of work function breaks down on the atomic scale; the measured values correspond to the contact potential difference ("local contact potential difference" or LCPD). The LCPD is the figure to be determined by KPFM. It has been shown that the LCPD varies on the atomic scale. The potential offset between the probe tip and the surface is measured using the cantilever as a reference electrode that forms a capacitor with the surface over which it is scanned, to obtain a map. Note that it does not have to be at constant separation (and usually is not). The LCPD corresponds to the voltage applied to the sample (with respect to the tip) that yields the minimal frequency shift $\Delta f(V)$. Two methods are known to find this minimum (i.e., the LCPD). The first method (voltage spectroscopy) consist of slowly sweeping the voltage, i.e., measuring the $\Delta f(V)$ relation and determining its minimum (voltage spectroscopy). The second method requires modulating the voltage (applying and oscillating an AC component plus a DC component) to find the DC voltage that yields the minimum frequency shift. The second method often employs lock in technique; often the second Eigen-resonance of the cantilever is used as frequency for the AC component, thus taking advantage of the cantilever's quality factor.

The electrostatic force microscopy (or EFM) directly measures the force produced by the electric field of the surface on a charged tip. In EFM, the frequency shift or amplitude change of the cantilever oscillation is monitored to detect the electric field. Still, EFM and KPFM are often regarded as a same general noncontact variant of AFM. Both EFM and KPFM require the use of conductive cantilevers, typically metal-coated silicon or silicon nitride.

KPFM and EFM become increasingly important for the characterization of molecular and atomic scale electronic functional structures as they provide a measure of the electrostatic field and/or Work functions. Therefore, such techniques are sensitive to charges and charge distributions. Charge resolution of about 0.1 electron charges combined with lateral resolution on the atomic scale was recently demonstrated in [3]. In particular, high resolution KPFM is foreseen to be of great importance when studying and developing future single electron logic devices or novel materials exploiting charge transfer, e.g. materials for OLEDs and materials for organic solar cells. However, to obtain high resolution maps as presented in [3], measurement times are on the order of a day for one KPFM map, corresponding to ~5000 measurement points (or pixels).

The two different techniques commonly used to measure KPFM maps are compared in [2]. Essentially, the first technique (voltage spectroscopy) provides high resolution but is slow, while the second technique (using lock-in technique) is fast but lacks resolution.

BRIEF SUMMARY OF THE INVENTION

According to a first aspect, the present invention is embodied as a method for determining a value of a local contact potential difference by noncontact atomic force microscopy. A method for determining a value of a local contact potential difference by noncontact atomic force microscopy. For one or more cantilever positions above a surface of a sample: i) determining two distinct voltage values of DC voltage applied between an oscillating cantilever and the sample, and ii) obtaining, by one or more processors, a value of a local contact potential difference based, at least in part, on the two distinct voltage values that were determined.

According to a second aspect, the invention is embodied as an atomic force microscopy apparatus, configured for performing atomic force microscopy measurements using an oscillating cantilever. The apparatus comprising: a frequency shift measurement unit configured for measuring a frequency shift of cantilever oscillation; a circuit connected to the frequency shift measurement unit, the circuit being configured to determine a DC voltage to be applied by the apparatus between a cantilever and a sample for an AFM measurement; and a processor connected to the memory to access said one or more pairs of voltage values, the processor being configured to determine values of local contact potential differences based, at least in part, on said one or more pairs.

DETAILED DESCRIPTION OF THE INVENTION

Apparatuses and methods embodying the present invention will now be described, by way of non-limiting examples, and in reference to the accompanying drawings. Technical features depicted in the drawings are not to scale. The following description is structured as follows. First, general embodiments and high-level variants are described (sect. 1). The next section addresses more specific embodiments and technical implementation details (sect. 2).

Sect. 1. General Embodiments and High-Level Variants

As evoked in introduction, two different methods are commonly used so far to measure KPFM maps. One of these methods (using lock-in techniques) is fast but lacks resolution, while the other one (voltage spectroscopy) provides high resolution but is slow. The novel methods proposed here add to the high resolution of the latter a faster measurement capability.

First, a brief review the advantages and drawbacks of the existing KPFM methods. KPFM is a scanning probe method related to non-contact atomic force microscopy (hereafter "NC-AFM"). In NC-AFM, a cantilever is oscillated at its resonance frequency. The cantilever holds the tip (probe). When the tip is approached to the surface the resonance in general will be changed due to the interaction between sample and tip. This frequency shift $\Delta f$ is the measurement signal in NC-AFM. In general, $\Delta f$ depends on the position (x, y, z) above the sample and the bias voltage V applied to the sample with respect to the tip: $\Delta f=\Delta f(V, x, y, z)$ or $\Delta f=\Delta f(V)$ for short. In KPFM, the relationship between $\Delta f$ and V is essential and one wants to measure two properties: (i) The voltage V* that yields the smallest absolute value of the frequency shift as a function of V and (ii) the frequency shift at this voltage: $\Delta f^*=\Delta f(V^*)$. This voltage V* is also called "local contact potential difference" (or LCPD). The LCPD is closely related to the so-called nulling potential. However, the electrostatic forces are not necessarily nullified in KPFM, they are only minimized (they are effectively nullified only when a plate capacitor is used).

As it can be realized, $\Delta f(V)$ is essentially symmetric near its peak (or vertex); $\Delta f(V)$ has the form of a parabola. The peak of the parabola (V*, $\Delta f^*$) corresponds to the values sought (see FIGS. 5-6); the peak varies as a function of the tip position (x, y, z).

Figure 6:
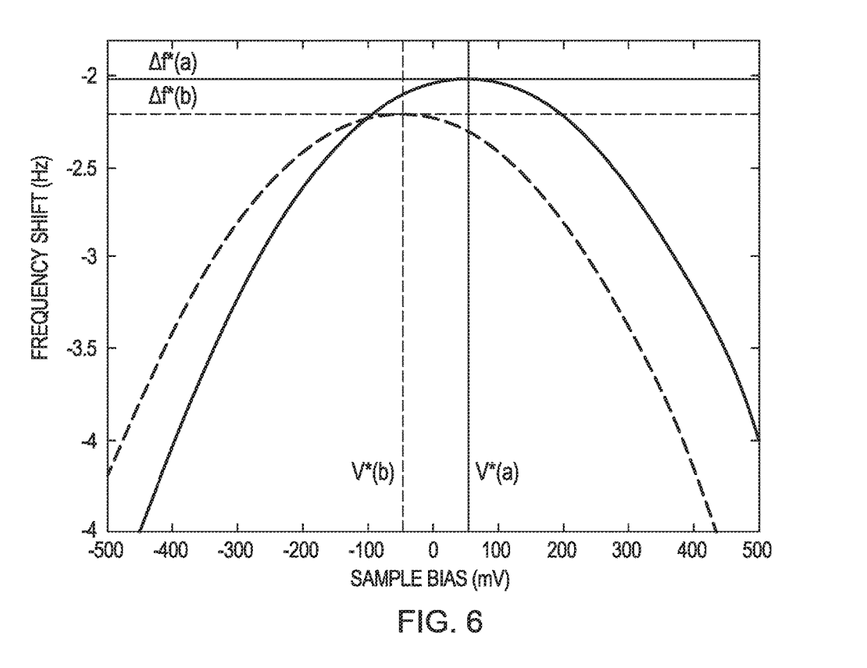
FIG. 6 shows two parabolas $\Delta f(V)$ measured at two different positions a and b, as well as various values to be determined according to present methods.

For example, FIG. 6 shows a schematic of two $\Delta f(V)$ parabolas, as obtained for two different positions (a and b). The different values to be determined are indicated: (V*(a), $\Delta f^*(a)=\Delta f(V^*(a))$) and (V*(b), $\Delta f^*(b)=\Delta f(V^*(b))$). In the case of a KPFM map acquired in the spectroscopic mode, the curve $\Delta f(V)$ is measured for each pixel of the map and the values (V*, $\Delta f^*$) are determined pixel by pixel [2,3].

Next, high resolution KPFM assumes that some conditions are met [3]. Most importantly, these are:

1) A high stability, usually provided by working at cryogenic temperatures. Moreover, KPFM maps are acquired in constant height mode, which requires small thermal drift. Thus, there is no feedback circuit needed to control the tip height. Additionally, interpretation of images is usually facilitated by measurements at constant height; and 2) To increase resolution and suppress noise in the frequency shift ($\Delta f$) channel, the $\Delta f$-channel should be measured with low bandwidth. For this reason KPFM measurements using lock-in techniques, modulating the bias to track the LCPD during movement of the tip, do not yield a resolution comparable to the spectroscopic method. Another reason for the comparably smaller resolution of this mode is that the DC voltage is always at the LCPD, but in this region the slope of $\Delta f(V)$ is minimal, therefore the error in the determination of the minimum of $|\Delta f(V)|$ is large.

The novel methods proposed here allow the acquisition speed of LCPD maps to be increased with respect to the spectroscopic mode, with unimpaired high resolution. These methods basically exploit the observed symmetry of the parabola $\Delta f(V)$ near its peak. The underlying idea is to perform two atomic force microscopy measurements at the same position (x, y, z) to determine two distinct voltage values V1, V2 on each side of the peak. This is done for each cantilever position (x, y, z) of interest. To obtain a 2D map, the (x, y, z) positions preferably span a plane. The two distinct voltage values are determined such as to yield a same value of frequency shift of the cantilever oscillation. The local contact potential difference V* is then easily obtained from the two distinct voltage values V1, V2, e.g., as an average thereof. The frequency shift can later be acquired at the same position, and for the voltage value V*, which drastically reduce the time of acquisition.

In reference to FIG. 1-6, a first aspect of the invention is now described in detail; this aspect concerns a method for determining a value of a local contact potential difference by noncontact atomic force microscopy.

First, a sample 30 is provided, step S10, the surface 32 of which is to be analyzed. Then, a series of measurements shall be performed for each cantilever position (x, y, z) above the surface 32 of the sample (step S20). In general these can be any positions above the sample surface 32. To obtain a 2D map one will preferably use the constant height mode, i.e. move the tip on a plane parallel to the surface 32 of the sample. In variants, and in particular if the surface 32 exhibits large corrugations, one may move the tip on a surface that essentially follows the topography of the sample surface 32.

In addition, measurements could also be performed at different tip heights (different z), in order to obtain 3D datasets. Thus, the AFM measurements need not be restricted to a given plane or surface (the latter should not be confused with the surface 32 of the sample). However, the following description mostly assumes constant height measurements, i.e., measurement points on a plane parallel to the sample surface (as this will generally be the case), for the sake of illustration but without prejudice.

Figure 1:
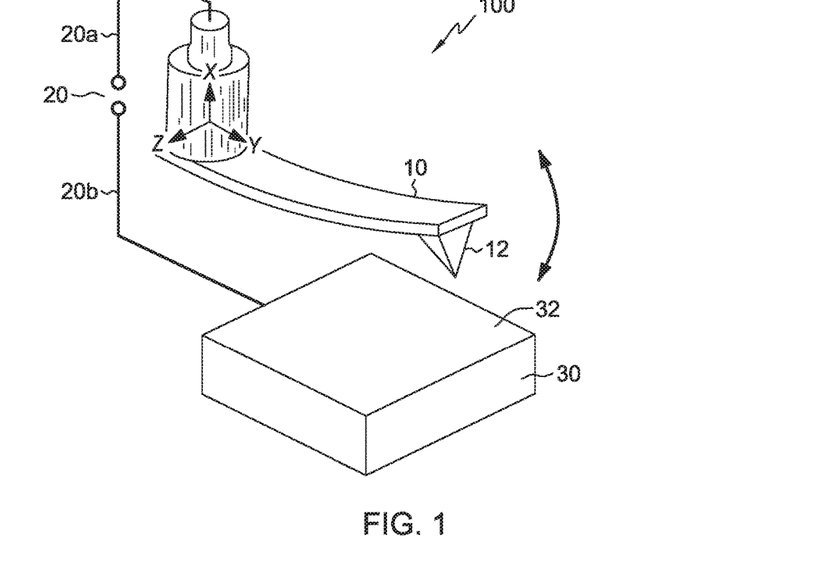
FIG. 1 is a view of a simplified representation of selected components of an atomic force microscopy apparatus, as used in embodiments.

For instance, two constant height AFM measurements (steps S31, S32) are performed using an oscillating cantilever 10, for each cantilever position (x, y, z) of interest above the surface 32 of the sample. Said constant height measurements allow two distinct voltage values V1, V2 of DC voltage (applied between the cantilever and the sample) to be determined, steps S311-S322. Said two values are determined such as to be on each side of the peak of the $\Delta f(V)$ curve. To ensure this, one needs to determine two values V1, V2, which yield a same value of frequency shift $\Delta f(V1)=\Delta f(V2)$. As evoked above, these two measurements could, in variants, follow the topography of the sample surface 32. As illustrated in FIG. 1, the DC voltages are measured across junction 20 with voltage connector 20a being attached to cantilever 10/tip 12 and voltage connector 20b being attached to sample 30.

The frequency shift is the difference of the measured frequency (near the surface 32, with a voltage applied) with respect to the frequency of the free (unperturbed) sensor (or in principle with respect to any reference frequency, the absolute value of the base frequency being unimportant). The measurement signal is a frequency difference (therefore called shift). The shift varies when moving the cantilever position or applying a voltage.

As the skilled person may appreciate, said two values V1, V2 need be sufficiently distinct, to ensure that they are located on opposite sides of the peak. Namely, the minimal shift between V1 and V2 needs be significantly larger (e.g., at least a factor 10) than the available voltage resolution (which notably depends on the resolution for $\Delta f$). The two values V1, V2 may therefore be subject to a minimal, predetermined shift between them. This predetermined shift can otherwise be determined by trial-and-error.

Next, step S40, the value of local contact potential difference (or LCPD value) V* can be determined based on the values V1, V2 previously obtained. For example, if the $\Delta f(V)$ curve is assumed to be perfectly symmetric about the peak (at least in the range of voltage values considered), then the LCPD value is a simple arithmetic average V*=(V1+V2)/2. If the $\Delta f(V)$ curve is known to exhibit some asymmetry about the peak, a predetermined model could be used, like V*=(r V1+(1−r) V2)/2, where r∈]0, 1[. More elaborated schemes could be contemplated, depending on the exact nature of the curve. A similar, modified scheme may for instance also be used to correct a known bias in the measurement of V1 and V2, etc.

The present approach is time efficient, because two distinct voltage values suffice, in principle, to determine the LCPD value V*. In particular, the methods proposed herein makes it possible to markedly increase the acquisition speed of LCPD maps with respect to the spectroscopic mode because the bias does not need to be ramped through the whole bias range at every pixel. Meanwhile, present methods essentially preserve the resolution. Incidentally, they preserve the tip 12, especially when tip functionalization is needed, e.g., to yield very high resolution. This is due to the limited number of measurements needed here, compared with spectroscopic methods, where the bias voltage is ramped quickly and often, such that the tip can suffer damage (e.g., the front atom or molecule gets lost).

Note that one could, in principle, achieve the same by (i) measuring three (or more) frequency shift values (anywhere on the parabola), fitting a parabola and extrapolating the vertex coordinates, or still by (ii) measuring a first frequency shift and then its first and second derivatives at the same point. However, as present inventors have realized, such alternatives would be much more consequently impacted by noise effects than the proposed approach, which benefits from fortunate compensations of errors, owing to the symmetry of the measurements about the principal vertex of the $\Delta f(V)$ curve.

Present methods can typically be applied to Kelvin probe force microscopy (also known as surface potential microscopy) or electrostatic force microscopy (EFM).

In the following, two main classes of embodiments will be described. In the first class of embodiments, the first constant height measurement provides a frequency shift $\Delta f1$ that shall serve as a reference for the second measurement. In the second class of embodiments, both the first and second measurements use the same, predetermined frequency shift value $\Delta f0$ as a reference.

Figure 3:
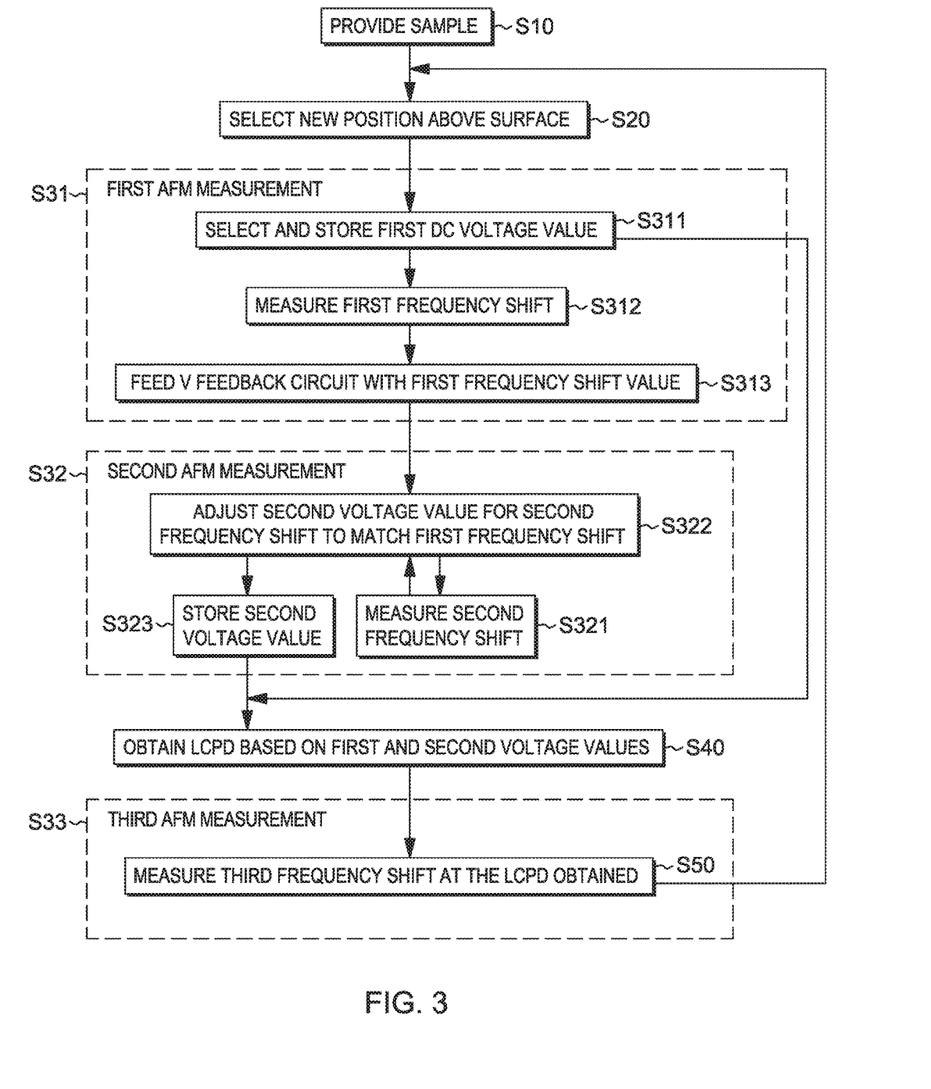
FIG. 3 is a flowchart illustrating high-level steps of a method for determining a value of a local contact potential difference, according to a first class of embodiments.

The first class of embodiments is now described in detail, in reference to FIG. 3. The determination of the two distinct voltage values V1, V2 requires two AFM measurements S31, S32, e.g., constant height measurements. During the first measurement S31, a first voltage V1 is selected and stored, S311, and a first frequency shift $\Delta f1$ is measured, S312. During the second measurement S32: a second frequency shift $\Delta f2$ is measured S321; then the DC voltage is adjusted S322, in order to obtain the second voltage value V2, distinct from V1, such that $\Delta f2$ as measured at step S321 is the same as $\Delta f1$. One may for instance aim at a resolution on the order of 10 mV for V. Still, there is no need to set a threshold in the measurement. Trying to obtain $\Delta f1=\Delta f2$ can be subject to a relevant tolerance t, as the skilled person may appreciate, that is, $|\Delta f1-\Delta f2|<t$, where t can be estimated from the resolution sought for V (e.g., 10 mV). Finally, the second voltage value V2 is stored, step S323.

This class of embodiments is advantageous inasmuch as no adjustment is needed during the first measurement, which increases the process speed.

Preferably, a constant value of DC voltage is used during the first constant height measurement S31, for each of said one or more positions. There is no strict need to change the voltage while scanning an area on the surface 32. The voltage does not need to be modulated in this mode. This allows the usage of a small bandwidth of the phase-locked loop (or PLL) for the determination of the frequency shift. Accordingly, the noise level in the frequency shift can be reduced and the resolution in the determination of V* and $\Delta f^*$ is increased.

More preferably, said constant value of DC voltage is selected such as to ensure that the first frequency shift stay on a same branch of the $\Delta f(V)$ curve for each position (x, y). I.e., the first frequency shift shall remain on a same side of the principal vertex of the curve. The adjusting mechanism (e.g., a feedback circuit) then knows what voltage direction is to be explored to find the second voltage. To illustrate this, consider FIG. 5: if V1 is known to be most certainly located on the left-hand side of the peak, then the adjusting circuit knows it needs to increase the voltage to locate the symmetric voltage value V2 that gives rise to the same value of frequency shift $\Delta f(V2)=\Delta f(V1)$. In variants, if it is not known on which side of the parabola the first voltage value V1 a priori is, it is only needed to calculate the slope at V1 to determine which direction to explore to find the symmetric value V2.

Figure 4:
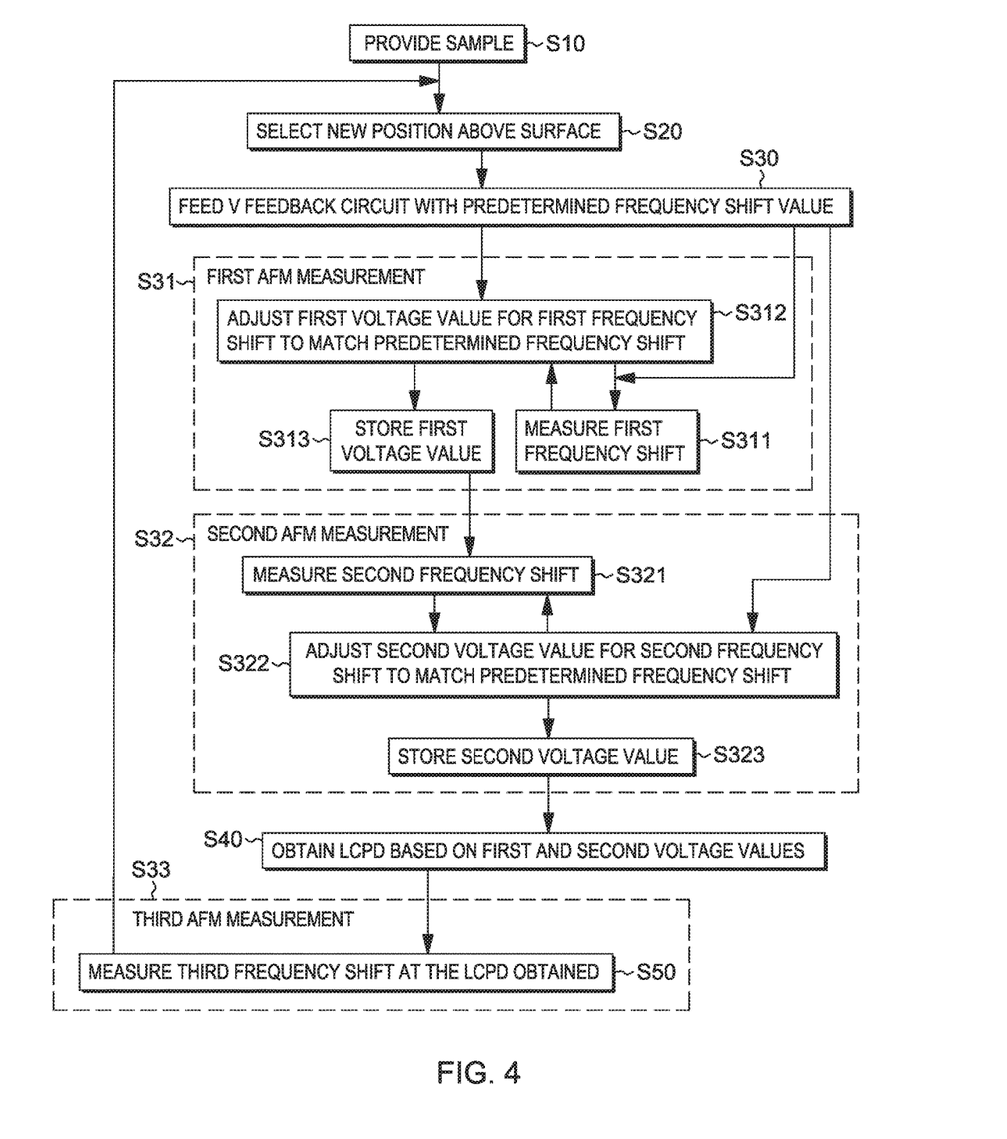
FIG. 4 is a variant to FIG. 3, illustrating high-level steps of a method according to a second class of embodiments.

Referring now to FIG. 4, in the second class of embodiments, also the first constant height measurement S31 comprises adjusting S312 the DC voltage applied between the cantilever and the sample to obtain V1, where V1 is such that $\Delta f1=\Delta f(V1)=\Delta f0$, and $\Delta f0$ is a predefined frequency shift. Accordingly, the $\Delta f$ setpoint does not need to be varied during the second measurement. Then, during the second constant height measurement S32, the second frequency shift $\Delta f2$ is measured S321 and the DC voltage adjusted S322, to obtain a value V2 distinct from V1, such that $\Delta f2$ (as measured S321) is the same as $\Delta f0$ (and effectively the same as $\Delta f1$ since, ideally, $\Delta f2=\Delta f1=\Delta f0$). In practice, one can use the same $\Delta f$ setpoint for both measurements (instead of using the value measured during the first measurement as a setpoint for the second measurement). In other words, $\Delta f0$ can be used as a reference value for both measurements. The first and second constant height measurement steps are essentially identical in that case, which results in reducing measurement artifacts. Still, a drawback of this variant is that it is somewhat slower than the previous class (but at most by a factor of 2), because now voltage adjustment is needed at each of the two constant height measurements.

Variants are now described which concern both classes of embodiments. For instance, referring to FIG. 2, the determination of a voltage value may most practically use a feedback circuit 26, wherein the frequency shift is used as a feedback signal to determine the second (or each of the first and second) voltage values. For example, in FIG. 3, feeding S313 feeds the voltage to feedback circuit 26 with the first frequency shift $\Delta f1$ value. In addition, the cantilever positions explored above the surface 32 may span a volume or a subset thereof (e.g., a 1D, 2D or 3D subset, since measurements might also be performed at different heights). Said subset may for instance be a 2D area, a line (involving several single-point measurements at different positions of the cantilever, which are distributed along a single line) or a pixel thereof. Single-point measurements (pixel) are less time efficient.

Figure 5:
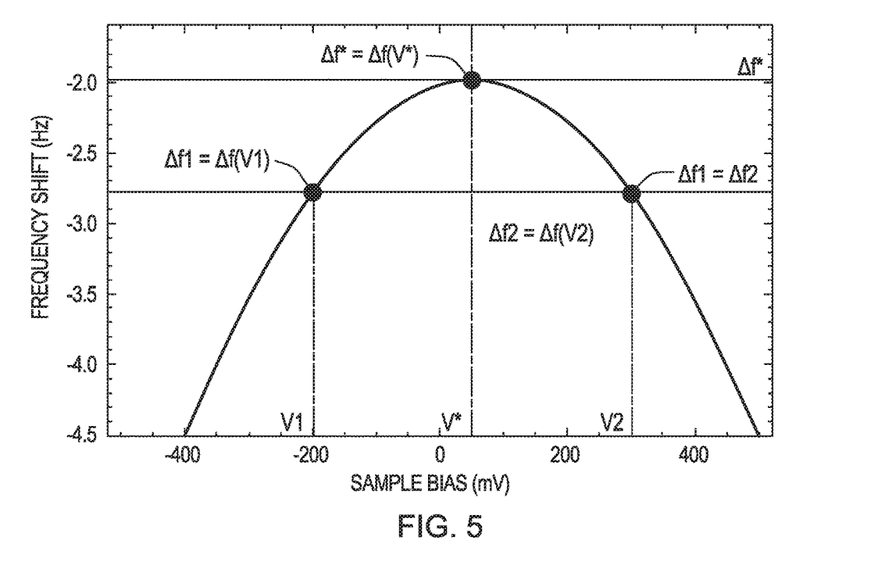
FIG. 5 shows a parabola representing the frequency shift $\Delta f(V)$ as a function of a DC voltage applied between the cantilever and the sample, and illustrates two distinct voltage values that yield a same value of frequency shift of cantilever oscillation.

Referring now to FIG. 3-5, the above methods may be used as a preamble to methods for acquiring Frequency shift maps, according to a second aspect of the invention. To that aim, and in addition to the steps described above, additional steps consist in performing a third constant height AFM measurement S33 for each cantilever position of interest. The LCPD value V* as determined earlier is used to measure $\Delta f(V^*)$ for each cantilever position S50.

Note that the embodiments of FIGS. 3, 4 reflect schemes where a given position of the tip is selected and the three AFM measurements are performed for that position, before moving to the next position. However, one may prefer to do a "first AFM measurement" (S31) at each of several positions and then a "second AFM measurement" (S32) at those positions, etc. The corresponding flowcharts are not depicted, for simplicity (they would require several additional arrows). Therefore, and in variants to the algorithms of FIGS. 3, 4, a sequence of first measurements may be performed first, to determine V1 for each of several cantilever positions, before performing a sequence of second measurements (to determine V2 for the same positions). Then, the third constant height measurement is performed to measure $\Delta f(V^*)$ for each of the same positions (S33). Each of the first, second and third measurements can be performed for a whole volume (above the surface 32) or a (1D, 2D or 3D) subsection thereof, e.g., to obtain a whole map. Doing it pointwise is more time consuming, though not excluded. A trade-off may be found, e.g., each measurement could be done stepwise, e.g., line by line. Smaller steps take more time, but are advantageous if there is a drift, since decreasing the time between two measurements at the different voltages decreases the effect of drift.

Note that the drift can not only be a thermal drift but also be due to piezo creep or piezo hysteresis. In general, drift decreases with decreasing temperatures. Therefore working at cryogenic temperatures is beneficial and allows for larger steps to be used, i.e., performing "first AFM measurement" at several positions before performing "second AFM measurements" at the same positions, etc.

Referring back to FIGS. 1, 2, another aspect of the invention is described which concerns an AFM apparatus 100. The latter is generally configured for performing AFM measurements using an oscillating cantilever. As noted earlier and assumed henceforth, the apparatus 100 is preferably designed for enabling constant height AFM measurements. It notably comprises a frequency shift measurement unit 21-23, generally configured for measuring a frequency shift of cantilever oscillation. This unit may notably comprise a deflection sensor 21, a bandpass filter 22 and a $\Delta f$ demodulator (PLL) 23, arranged as in FIG. 2, which components are known per se.

In order to enable methods such as described above, the apparatus further comprises a circuit 26, suitably connected to the frequency shift measurement unit and notably configured to:

Determine a DC voltage to be applied by the apparatus (between the cantilever and the sample), when performing a constant height measurement such as described earlier; and Adjust such a DC voltage such that a value of frequency shift $\Delta f2$ as measured by the frequency shift measurement unit during a constant height measurement matches a reference frequency shift (be it a predetermined value $\Delta f0$ or a value corresponding to a previously measured shift $\Delta f1$).

Figure 2:
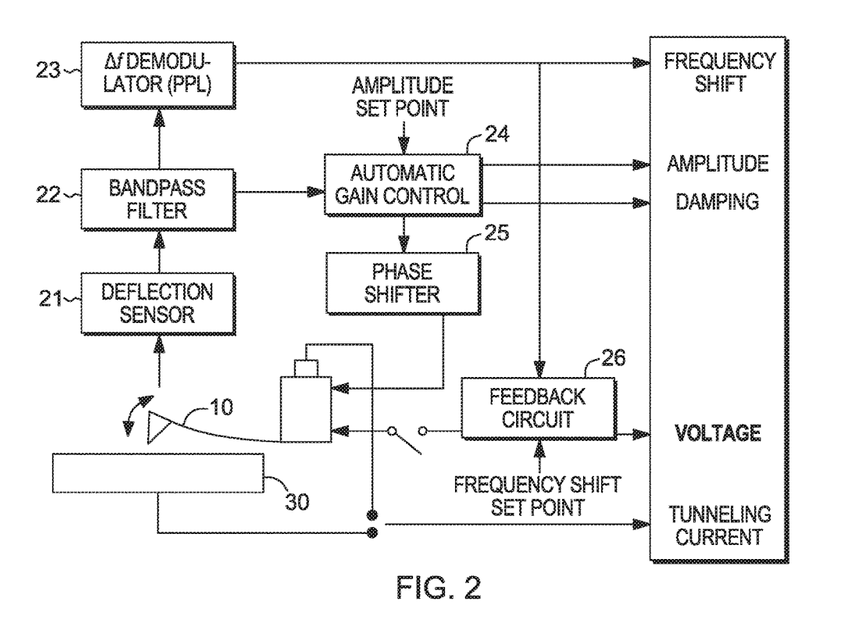
FIG. 2 is a diagram schematically illustrating selected components of an atomic force microscopy apparatus according to embodiments.

The apparatus may further comprise an automatic gain control unit 24 and a phase shifter 25, as usual in the art and as illustrated in FIG. 2. Frequency modulation mode is used: the amplitude can be kept constant using a separate feedback loop.

Furthermore, the apparatus typically comprises memory means (not shown), for storing one or more pairs of distinct values of DC voltages (corresponding to a same value of frequency shift measured). Processing means are provided too (not shown), which cooperate with the memory means to access said pairs of voltage values. The processing means are notably configured for determining values of LCPD values V* based on such pairs, as explained earlier. The memory means and processing means can be integrated. The circuit 26 itself may be at least partly integrated with the processing means or use the processing capability of the processing means to perform its function, or part thereof.

Various algorithms may be used by the circuit 26 to adjust and determine a voltage value V($\Delta$f), i.e., corresponding to a given frequency shift value. For instance, sampling techniques and extrapolation techniques may be involved. Most advantageous, however, is to have the circuit 26 configured as a feedback circuit, as evoked earlier. The feedback circuit 26 can be suitably connected to the frequency shift measurement unit 21-23, as seen in FIG. 2, such as to use the frequency shift as a feedback signal to determine the second (or each of the first and second) voltage values. The circuit 26 can thus adjust a DC voltage such that a value of frequency shift $\Delta$f1, $\Delta$f2 measured by the frequency shift measurement unit be the same as a reference frequency shift $\Delta$f0, $\Delta$f1.

Note that, with respect to a usual frequency modulation AFM, only the feedback circuit needs be modified to implement the essential, novel functions described herein. Namely, a "voltage" feedback (using $\Delta$f as feedback signal) is used instead (or in addition to) a usual "z feedback circuit", as known in the constant frequency mode in usual frequency modulation AFM. The property monitored is accordingly a voltage instead of the topography.

In embodiments, the circuit 26 has two selectable modes, wherein:

In the first mode, the circuit does not adjust the DC voltage to be applied; and In the second mode, the circuit adjusts the DC voltage to be applied, such that a value of frequency shift $\Delta$f2 (as measured by the frequency shift measurement unit) matches the reference frequency shift (be it $\Delta$f0 or $\Delta$f1).

The ability to pass from one mode to the other notably allows for implementing the first class of embodiments described earlier.

The apparatus is otherwise configured for acquiring a Frequency shift map: to that aim, constant height AFM measurement are performed using LCPD values as determined by the processing means.

The above embodiments have been succinctly described in reference to the accompanying drawings and may accommodate a number of variants. Several combinations of the above features may be contemplated. Examples are given in the next section.

2. Specific Embodiments/Technical Implementation Details

To illustrate the above concepts, an example of acquisition of a LCPD map and a $\Delta$f* map is now described in reference to FIGS. 5 and 6.

During a sequence of first constant height measurements, a reference $\Delta$f map is measured at constant bias V1 (FIG. 5). The bias V1 is chosen in such a way that for all cantilever positions of the map one stays on the same flank of the $\Delta$f(V) parabola. As evoked in the previous section, V1 can be chosen to always stay on the rising flank ($\partial[\Delta f(V)]/\partial V > 0$) of the parabolas. Thus, the complete first image is measured at the same bias voltage V1, i.e. like a usual NC-AFM constant height measurement.

During a sequence of second constant height measurements, the second map is acquired for the same positions as already used for the first sequence, but at different voltages V2. Note that the coordinates x, y, and z are the same at both measurements. In general the positions can be any positions above the sample surface 32. To obtain a 2D map of the sample surface 32, one will preferably use the constant height mode, i.e. move the tip on a predetermined plane that is parallel to the surface 32. Or, for samples with large corrugations, the tip may be moved on a surface that essentially follows the topography of the sample surface 32, as noted earlier. Still, measurements along 3D paths (realizing, e.g., 3D maps, vertical lines, or tilted planes) can also be performed. The other, distinct values V2 are on the other flank of the $\Delta$f(V) parabola compared to the first measurements. In the second measurements, the feedback circuit 26 is used to determine and apply the voltage V2 that yields the same $\Delta$f as V1, when applied at a given position. In other words, the feedback circuit finds and applies V2 such that $\Delta$f(V2)=$\Delta$f(V1), i.e., for each point (x1, y1, z1), one has $\Delta f(V2)|_{(x1,y1,z1)} = \Delta f(V1)|_{(x1,y1,z1)}$. The LCPD map is obtained after these second measurements by the values V*=(V1+V2)/2 (for each position), i.e., the set of values V*(x, y, z) is the LPCD map.

After this second sequence, a third sequence of constant height measurements is performed to acquire the $\Delta$f* map, i.e., $\Delta$f* is measured for each LCPD value V* at each position.

FIG. 6 considers two positions a and b as examples. In the first step, the voltage is set to the value V1 for each position (a and b) and the values $\Delta$f(V1, a) and $\Delta$f(V1, b) are measured. In the second step, a feedback circuit on V($\Delta$f) finds the voltages V2 such that $\Delta$f(V2, a)=$\Delta$f(V1, a) and $\Delta$f(V2, b)=$\Delta$f(V1, b) with V1<V2 if $\partial[\Delta f(V)]/\partial V|_{V1} > 0$ and V1>V2 if $\partial[\Delta f(V)]/\partial V|_{V1} < 0$. In variants, the feedback circuit may be used to measure the frequency shift at each position a and b such that $\Delta$f(V2, a)=$\Delta$f(V1, a)=$\Delta$f0 and $\Delta$f(V2, b)=$\Delta$f(V1, b)=$\Delta$f0. The predetermined value $\Delta$f0 does, strictly speaking, not need to be the same at each position a and b.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, the predetermined reference frequency shift value $\Delta$f0 may vary, e.g., be optimized as a function of the position (x, y, z).

The invention claimed is:

1. A method for determining a value of a local contact potential difference by noncontact atomic force microscopy, the method comprising:
   for one or more cantilever positions above a surface of a sample:

determining two distinct voltage values of DC voltage applied between an oscillating cantilever and the sample; and determining, by one or more processors, a value of a local contact potential difference based, at least in part, on the two distinct voltage values that were determined.

2. The method of claim 1, the method comprising:
performing two atomic force microscopy measurements, using an oscillating cantilever to generate the two distinct voltage values of DC voltage applied between the cantilever and the sample.

3. The method of claim 1, wherein substantially similar distinct voltage values indicate substantially similar values of frequency shifts of cantilever oscillation.

4. The method of claim 1, wherein determining the two distinct voltage values further comprises:
during a first AFM measurement:
selecting and storing a first voltage value of DC voltage applied between the oscillating cantilever and the sample;
measuring a first frequency shift corresponding to said first voltage value; and
storing a corresponding first voltage value of DC voltage applied between the oscillating cantilever and the sample; and
during a second AFM measurement:
measuring a second frequency shift;
adjusting a DC voltage applied between the cantilever and the sample, to obtain a second voltage value distinct from the first voltage value, such that the second frequency shift measured is the same as said first measured frequency shift; and
storing the second voltage value.

5. The method of claim 4, wherein a constant value of DC voltage is used during the first AFM measurement, for each of said one or more positions.

6. The method of claim 5, further comprising:
prior to using said constant value of DC voltage for the first AFM measurement, selecting said constant value such that a corresponding frequency shift of cantilever oscillation shall be on a same branch of the curve representing the frequency shift vs. an applied DC voltage, where said branch terminates at a principal vertex of the curve, for each of said one or more positions.

7. The method of claim 4, wherein generation of the first AFM measurement comprises:
adjusting a DC voltage applied between the oscillating cantilever and the sample to obtain the first voltage value, such that the first measured frequency shift is the same as a predefined frequency shift.

8. The method of claim 1, wherein determining two distinct voltage values of DC voltage applied between an oscillating cantilever and the sample comprises:
adjusting a DC voltage during a first measurement or each of the first measurement and a second measurement, via a feedback circuit using a frequency shift signal as a feedback signal, for determining a value of DC voltage corresponding to a given value of frequency shift, while in constant height mode.

9. The method of claim 1, wherein the value of the local contact potential difference is an average of the two distinct voltage values stored.

10. The method of claim 1, wherein the one or more cantilever positions above the surface of the sample respectively span a subset of a volume above the sample surface, wherein the subset is one of: a 3D, a 2D, or a 1D portion of said volume.

11. The method of claim 4, the method further comprising:
acquiring a frequency shift map by performing a third AFM measurement for each of the one or more cantilever positions above the surface of the sample, using the local contact potential difference as determined for each of the one or more oscillating cantilever positions;
wherein, the first AFM measurement is performed for each of the one or more oscillating cantilever positions above the surface of the sample, and then the second AFM measurement is performed for each of the one or more oscillating cantilever positions, and then the third AFM measurement is performed for each of the one or more oscillating cantilever positions.

12. An atomic force microscopy apparatus, configured for performing atomic force microscopy measurements using an oscillating cantilever, the apparatus comprising:
a frequency shift measurement unit configured for measuring a frequency shift of cantilever oscillation;
a circuit connected to the frequency shift measurement unit, the circuit being configured to determine a DC voltage to be applied by the apparatus between a cantilever and a sample for an AFM measurement; and
a processor connected to the memory to access said one or more pairs of voltage values, the processor being configured to determine values of local contact potential differences based, at least in part, on said one or more pairs.

13. The apparatus of claim 12, the apparatus comprising:
a memory that is configured to store one or more pairs of distinct values of DC voltages that correspond to a same value of frequency shift of cantilever oscillation.

14. The apparatus of claim 12, wherein the processor is configured to determine a value of the local contact potential difference as an average of two distinct DC voltage values in a given one of said one or more pairs.

15. The apparatus of claim 12, wherein the apparatus is at least one of a Kelvin probe force microscopy apparatus or an electrostatic force microscopy apparatus.

16. The apparatus of claim 12, wherein the apparatus is further configured to acquire a frequency shift map by performing one or both of AFM measurement and constant height AFM measurements, using local contact potential differences.

17. The apparatus of claim 12, wherein the circuit connected to the frequency shift measurement unit is configured to adjust such a DC voltage such that a value of a frequency shift, as measured by the frequency shift measurement unit, matches a reference frequency shift.

18. The apparatus of claim 17, wherein the circuit is i) configured as a feedback circuit; ii) connected to the frequency shift measurement unit; iii) configured to use a frequency shift signal as a feedback signal; and iv) configured to adjust a DC voltage such that a value of frequency shift measured by the frequency shift measurement unit is the same as a reference frequency shift.

19. The apparatus of claim 17, wherein the circuit has two selectable modes, wherein:
in a first selectable mode, the circuit does not adjust the DC voltage to be applied; and
in a second the selectable mode, the circuit adjusts the DC voltage to be applied, such that a value of frequency shift measured by the frequency shift measurement unit matches a reference frequency shift.

* * * * *